(12) United States Patent
Olzak et al.

(10) Patent No.: US 6,796,807 B2
(45) Date of Patent: Sep. 28, 2004

(54) ADAPTER FOR SURFACE MOUNT DEVICES TO THROUGH HOLE APPLICATIONS

(75) Inventors: Richard A. Olzak, Kirkland, WA (US); Tehmosp Khan, Shorline, WA (US)

(73) Assignee: Honeywell International, Inc., Morristown, NJ (US)

( * ) Notice: Subject to any disclaimer, the term of this patent is extended or adjusted under 35 U.S.C. 154(b) by 0 days.

(21) Appl. No.: 10/431,915

(22) Filed: May 7, 2003

(65) Prior Publication Data

US 2003/0211759 A1 Nov. 13, 2003

Related U.S. Application Data

(60) Provisional application No. 60/379,722, filed on May 9, 2002.

(51) Int. Cl.[7] .............................................. H01R 12/00
(52) U.S. Cl. ..................................................... 439/76.1
(58) Field of Search ................................ 439/68–73, 83

(56) References Cited

U.S. PATENT DOCUMENTS

| | | | | |
|---|---|---|---|---|
| 3,865,454 A | * | 2/1975 | Blinder | 439/78 |
| 4,872,844 A | * | 10/1989 | Grebe et al. | 439/69 |
| 5,036,431 A | | 7/1991 | Adachi et al. | |
| 5,410,452 A | * | 4/1995 | Sinclair et al. | 361/791 |
| 5,438,481 A | * | 8/1995 | Murphy et al. | 361/813 |
| 5,564,932 A | * | 10/1996 | Castleman | 439/70 |
| 5,590,029 A | * | 12/1996 | Estes | 361/760 |
| 5,625,944 A | | 5/1997 | Werther | |
| 5,758,413 A | | 6/1998 | Chong et al. | |
| 6,046,911 A | | 4/2000 | Dranchak et al. | |
| 6,270,362 B1 | * | 8/2001 | Guran et al. | 439/83 |

* cited by examiner

*Primary Examiner*—Ross Gushi
*Assistant Examiner*—Ann McCamey
(74) *Attorney, Agent, or Firm*—Charles J. Rupnick

(57) ABSTRACT

An electrical adapter formed of a printed wiring board having opposing primary and secondary sides and at least one printed circuit having a plurality of solder pads arranged to interconnect with input/output signal pins of a surface mount technology (SMT) device and a plurality of plated vias arranged to interconnect with input/output signal pins of one or more discrete electrical components; one or more plated through holes extending between the primary and secondary sides of the board and electrically coupled to the printed circuit, the plated through holes being positioned in a pattern structured to match plated through holes in a parent circuit board; and a plurality of input/output signal interconnect pins mechanically and electrically coupled to the plated holes and extending a distance beyond the secondary side of the board.

17 Claims, 2 Drawing Sheets

ADAPTER FOR SURFACE MOUNT DEVICES TO THROUGH HOLE APPLICATIONS

This application claims the benefit of U.S. Provisional Application Serial No. 60/379,722, filed in the names of Richard A. Olzak and Tehmosp Khan on May 9, 2002, the complete disclosure of which is incorporated herein by reference.

FIELD OF THE INVENTION

The present invention relates to electrical devices and methods, and in particular to devices and methods for adapting surface mount devices to through hole device applications.

BACKGROUND OF THE INVENTION

An integrated circuit combines numerous active and passive electrical circuitry elements on a single device called a die or chip. These integrated circuits are interconnected by attaching them to printed circuit boards. Integrated circuits are small and fragile; therefore, for use in mass production they are often sealed in metal packages to protect them from damage. FIG. 1 is a generic illustration of one such metal package 1 of the well-known TO-type having a hermetically sealed can package 3. The integrated circuit is electrically terminated via two or more leads 5 that extend from the package 3, typically in a circular pattern or multiple concentric circular patterns. The leads 5 are used to connect the device to a printed wiring board or a socket.

The wiring on application or parent printed circuit boards include thin metallic signal lines embedded in an insulating material. These signal lines interconnect leads from different circuit packages mounted on the same board. The boards may have several layers of interconnected signal lines to provide all of the required connections. The signal lines route electrical signals among the integrated circuits. The lay out of the signal lines thus determines the placement of the integrated circuit packages on the board. The leads of the integrated circuit packages may connect to the wiring in a variety of ways. One technique includes holes drilled in the board through the wiring at appropriate locations. The leads are inserted through the holes and soldered, whereby mechanical and electrical attachments are made among the leads, the wiring, and the holes.

Another technique is called surface mount technology (SMT). This method includes arranging contact pads on the surface of the printed circuit board. The pads are used to route input/output electrical signals through the leads and the appropriate signal lines in the parent printed circuit board. The package leads may be placed on top of the pads and mechanically and electrically attached by soldering. SMT is widely used for high speed digital communications. Typical SMT packages include plastic leaded chip carriers (PLCC), dual in-line packages (DIP), single in-line packages (SIP), small outline packages (SO), thin small outline packages (TSO), and small outline T-leaded packages (SOT). Each device has a different specific footprint associated with its external leads.

FIG. 2 is a generic illustration of a common SMT integrated circuit carrier 10 of the type that is commonly referred to as a Plastic Leaded Chip Carrier, usually abbreviated as PLCC or PCC. The carrier 10 is a rectangular or square package having a housing 12 with a top surface 14 and four sides 16–19 with I/O connections on all four sides. On the leaded version illustrated in FIG. 2, the I/O connections are a row of uniformly spaced electrically conductive leads 20 extending from each side of the carrier housing 12. The PLCC 10 can have 18 to 100 J-shaped leads. PLCC packages can be either socketed or surface-mounted onto solder pads of a printed wiring board 22. Soldering is preferred for applications requiring long term electrical and mechanical reliability.

Over time the design of SMT integrated circuits, or ICs, has improved functionality, which has resulted in smaller devices with fewer I/O connections required to perform the same tasks more efficiently than the older TO-type packaged devices. The carriers, such as the PLCC 10 illustrated in FIG. 2, have evolved to replace the older TO-type packaged devices. According to one example, one or more known ICs packaged in a TO-type package has become obsolete through having its functionality provided more efficiently in a newer IC that is packaged in a more compact SMT device having a smaller foot print.

New printed wiring board designs reduce the space available to match the more compactly packaged SMT device and provide surface-mount solder pads in an appropriate footprint. However, many pre-existing printed wiring board are designed for use with the now superceded or obsolete TO-type packaged devices. While an SMT-type replacement device is functionally equivalent and conveniently smaller, these earlier designs will not accept the newer SMT-type device. Some high-production boards have been redesigned and re-laid out to accommodate the new smaller SMT-type devices having a smaller foot print. However, board redesign requires considerable time that impacts production schedules and involves financial investments that may not be easily justified on legacy products with a limited future.

Rather than bear the disruption and expense of a redesign, some of these legacy products use an adapter that accommodates the difference in footprints and technology between the TO-type and SMT-type devices.

Unfortunately, known adapters for TO-type and SMT-type devices are limited.

SUMMARY OF THE INVENTION

The present invention overcomes limitations of the prior art by providing an electrical device adapter that adapts a surface mount technology (SMT) device to through hole applications, whereby a superceded or obsolete electrical device housed in a conventional TO-type device package is replaced by a functionally equivalent and conveniently smaller SMT device.

Accordingly, the present invention provides an electrical device adapter that includes: a printed wiring board having at least a circuit layer and a ground layer between opposing primary and secondary sides; a plurality surface mount technology (SMT) device solder pads arranged on the primary side of the printed wiring board to accommodate a plurality of input/output signal pins of a SMT device; a plurality of plated vias electrically coupled between the solder pads and the circuit layer of the printed wiring board; a first plurality plated through holes extending between the primary and secondary sides and being electrically interconnected to the circuit layer of the printed wiring board, different pairs of the first plurality of plated through holes being structured to accommodate different discrete electrical components; a second plurality plated through holes extending between the primary and secondary sides and being electrically interconnected to the circuit layer of the printed wiring board, the second plurality of plated through holes being arranged in a pattern structured to imitate leads of a conventional TO-type device package; and an elongated input/output signal interconnect pin soldered in two or more of the second plurality plated through holes and extending a distance from the secondary side of the printed wiring board.

According to another aspect of the invention, the a plurality of plated vias of the electrical device adapter that are electrically coupled between the solder pads and the circuit layer of the printed wiring board are embodied as a third plurality of plated through holes extending between the primary and secondary sides and being electrically interconnected to the circuit layer of the printed wiring board.

According to another aspect of the invention, the second plurality of plated through holes of the electrical device adapter form a circular pattern.

According to another aspect of the invention, the printed wiring board of the electrical device adapter includes only a single circuit layer and a single ground layer between the primary and secondary sides.

According to still another aspect of the invention, the electrical device adapter is embodied to replace an obsolete oscillator circuit housed in a TO-type device package with one or more SMT devices and one or more discrete components, whereby a signal input to the electrical adapter via one or more of the interconnect pins equivalent to input signal leads of an oscillator circuit housed in a TO-type device package generates an output signal on one or more different ones of the interconnect pins equivalent to output signal leads of an oscillator circuit housed in a TO-type device package that is equivalent to an oscillator circuit housed in a TO-type device package.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF PREFERRED EMBODIMENT

In the Figures, like numerals indicate like elements.

The present invention is an apparatus and method for adapting surface mount technology (SMT) devices to through hole applications, whereby a superceded or obsolete electrical device is replaced by a functionally equivalent and conveniently smaller SMT device.

The adapter apparatus of the invention including a printed wiring board having ground and circuit layers between opposing primary and secondary sides, the circuit layer being interconnected to the primary side of the board by one or more plated through holes extending between the primary and secondary sides and positioned in a circular pattern to match plated through holes in a parent circuit board, and a plurality of input/output signal interconnect pins inserted through the plated holes and extending a distance beyond the secondary side of the board, the interconnect pins being mechanically and electrically coupled to the board via the plated through holes that are further interconnected to the circuit layer between opposing primary and secondary sides. Solder pads arranged to interconnect with input/output signal pins of a SMT device, the solder pads electrically interconnected to the circuit layers between opposing primary and secondary sides. A quantity of plated vias arranged between the primary side of the board and the circuit layer between opposing primary and secondary sides, the plated vias being structured for accepting one or more discrete electrical components. The circuit layer having circuitry that interconnects the SMT pads, and the discrete component vias and the interconnect pin plated through holes according to a pre-selected pattern, whereby discrete components installed in the plated vias moderate a functionality of an SMT electrical device installed on the solder pads for providing the functionality of a superceded or obsolete electrical device.

Figure 3:
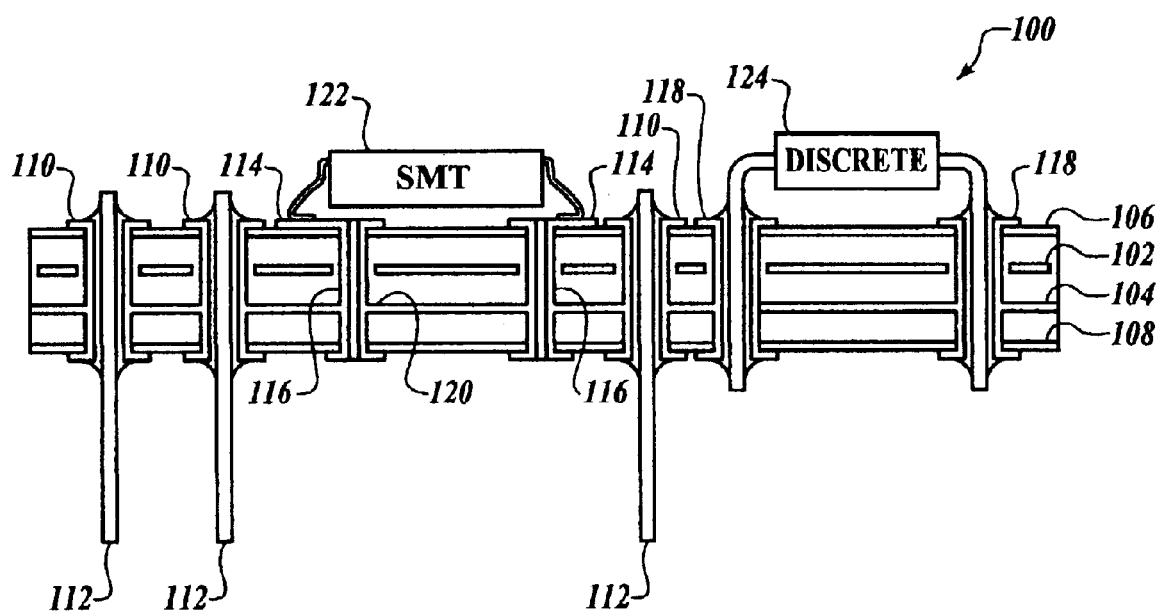
FIG. 3 is a cross-sectional view that illustrates the adapter apparatus of the invention embodied as a printed wiring board.

FIG. 3 is a cross-sectional view that illustrates the adapter apparatus of the invention embodied as a printed wiring board 100 having a ground layer 102 and a circuit layer 104 between opposing primary and secondary sides 106, 108. Alternatively, the circuit layer 104 is provided by one or more electrical traces formed by conventional manufacturing techniques on the surface of the primary board side 106. The circuit layer 104 is electrically interconnected to the primary side 106 of the board 100 by one or more plated through holes 110 that extend between the primary and secondary sides 106, 108 and are interconnected to the intermediary circuit layer 104. The plated through holes 110 are arranged in a circular pattern (shown more clearly in FIG. 4) that is structured to imitate the leads 5 that extend from the TO-type package 3 shown in FIG. 1 or another such device. The pattern of plated through holes 110 is thus arranged to match plated through holes in a parent circuit board (not shown) designed to accommodate the superceded or obsolete electrical device to be replaced. An appropriate quantity of elongated input/output signal interconnect pins 112 are inserted through the plated holes 110 to extend a distance beyond the secondary side 108 of the board 100. The interconnect pins 112 are mechanically and electrically coupled to the board via the plated through holes 110 and extend through the printed wiring board 100 and beyond the surface of the secondary side 108 far enough to mate the adapter apparatus of the invention to a printed wiring board or a socket (not shown). The length of the interconnect pins 112 is thus a function of the thickness of both the printed wiring board 100 and printed wiring board or a socket to which the adapter apparatus of the invention is assembled.

A quantity of solder pads 114 are arranged on the board primary side 106 in a pattern to accommodate the relevant input/output signal pins of a SMT electrical device pre-selected to provide the equivalent functionality of the superceded or obsolete electrical device to be replaced. Multiple plated vias, shown by example and without limitation as plated through holes 116, electrically interconnect the SMT solder pads 114 to the circuit layer 104 between opposing primary and secondary board sides 106, 108.

A quantity of plated vias 118, either blind vias or plated through holes (shown by example and without limitation) are arranged on the primary board side 106 and interconnect with circuitry on the circuit layer 104. The plated vias 118 are structured to accommodate one or more discrete electrical components as a function of the adapter's specific purpose.

The circuit layer 104 is structured with a printed circuit 120 formed of electrical traces that interconnect the SMT solder pads 114 and the discrete component plated vias 118 according to a pre-selected pattern, whereby discrete components installed in the plated vias 118 moderate a functionality of an SMT electrical device installed on the solder pads for providing the functionality of a superceded or obsolete electrical device. By example and without limitation, the SMT device is an oscillator that replaces the functionality of a superceded or obsolete design packaged in a TO-type package with conventional pin-type I/O interconnects One or more discrete components, such as resistors and capacitors, are interconnected by the printed circuit 120 with the inputs and outputs of the SMT device to modulate the replacement oscillator's operation. The printed circuit 120 interconnects the modulated inputs and outputs of the SMT device with the interconnect pin plated through holes 110. The interconnect pins 112 are soldered in the plated through holes 110 to make both mechanical and electrical connections with the printed circuit 120. A portion of each interconnect pin 112 extends from the secondary side 108 of the board 100 in a pattern determined by the pattern of plated through holes 110 to mate the adapter apparatus of the invention to a printed wiring board or a socket (not shown).

According to one embodiment of the invention, a SMT device 122, such as an oscillator or another SMT device structured to replace the functionality of a superceded or obsolete design packaged in a TO-type package, and one or more discrete electrical components 124 selected to modulate either or both of one or more of the inputs and outputs of the SMT device 122 are installed on the board 100 by soldering. Additional SMT devices 122, such as capacitors and inductors also selected to modulate either or both of one or more of the inputs and outputs of the SMT device 122, are optionally installed on the board 100 at additional SMT solder pads 114.

Figure 4:
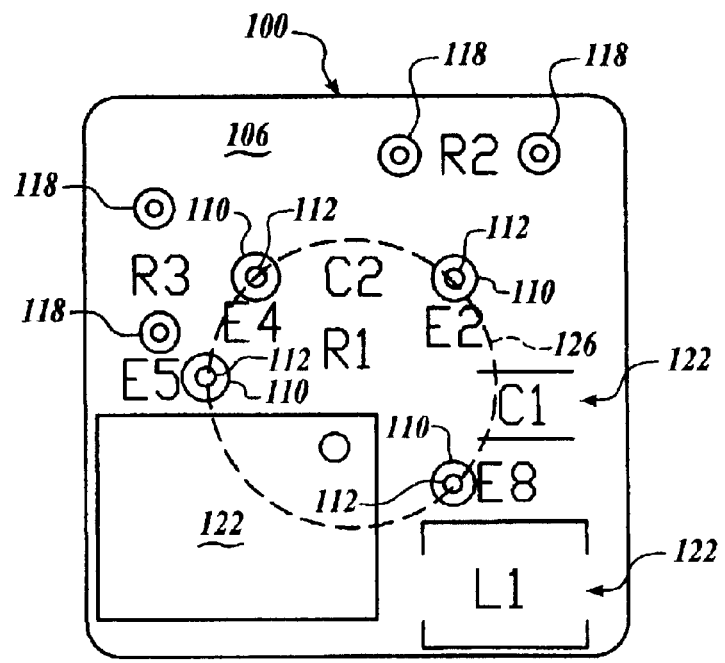
FIG. 4 is a top down view of a generic illustration of a primary side of the adapter of the invention for surface mount devices to through hole applications.

FIG. 4 is a plan view that illustrates the adapter apparatus of the invention embodied as the printed wiring board 100 showing the primary side 106 having a primary SMT device 122, such as an oscillator replacing the functionality of a superceded or obsolete oscillator packaged in a TO-type package, and one or more additional SMT devices 122, such as capacitors C1 and inductors L1 selected to modulate either or both of one or more of the inputs and outputs of the oscillator SMT-device. FIG. 4 also shows multiple plated vias 118 arranged to accommodate one or more discrete electrical components 124, such as resistors, also selected to modulate either or both of one or more of the inputs and outputs of the oscillator SMT device.

Figure 1:
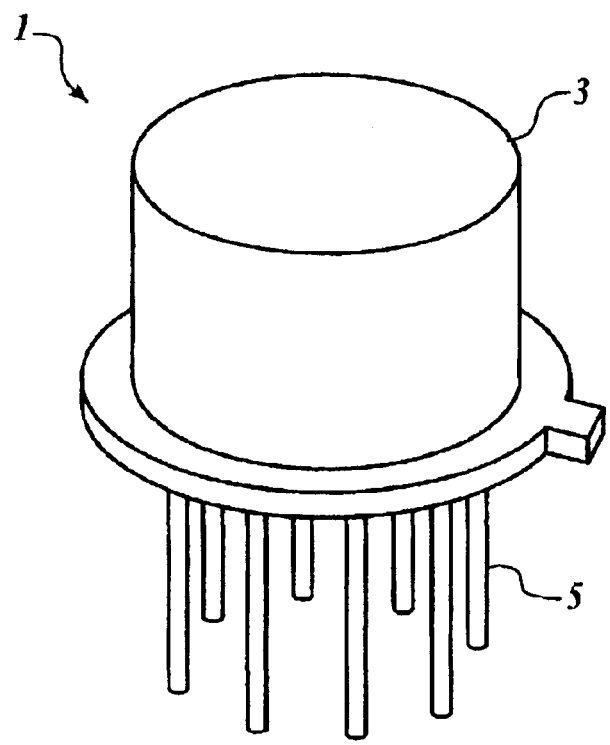
FIG. 1 is a generic illustration of a common TO-type device package.
Figure 2:
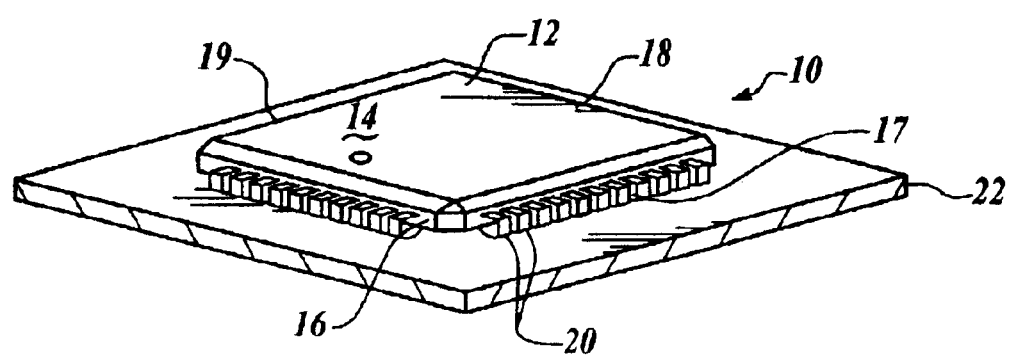
FIG. 2 is a generic illustration of a common surface mount technology (SMT) integrated circuit package of the type that is commonly referred to as a Plastic Leaded Chip Carrier (PLCC)

As illustrated in FIG. 4, the multiple plated through holes 110, and the interconnect pins 112 installed therein, are arranged in a circular pattern 126 that is structured to imitate the leads 5 that extend from the TO-type package 3 shown in FIG. 1 or another such device. The adapter apparatus of the invention embodied as the printed wiring board 100 is thus structured to interface an SMT device and selected modulating discrete components in a package that readily replaces a superceded or obsolete circuit packaged in a TO-type package with equivalent functionality.

While the preferred embodiment of the invention has been illustrated and described, it will be appreciated that various changes can be made therein without departing from the spirit and scope of the invention.

What is claimed is:

1. An electrical adapter, comprising:
   a printed wiring board having opposing primary and secondary sides and at least one printed circuit having a plurality of solder pads arranged to interconnect with input/output signal pins of a surface mount technology (SMT) device and a plurality of plated vias arranged to interconnect with input/output signal pins of one or more discrete electrical components;
   one or more plated through holes extending between the primary and secondary sides of the board and electrically coupled to the printed circuit, the plated through holes being positioned in a pattern structured to match plated through holes in a parent circuit board; and
   a plurality of input/output signal interconnect pins mechanically and electrically coupled to the plated holes and extending a distance beyond the secondary side of the board, the entirety of the input/output signal interconnect pins extending beyond the secondary side of the board being arranged in a circular pattern that is structured to imitate leads extending from a TO-type package.

2. The electrical adapter of claim 1 wherein the printed wiring board further comprises at least a ground layer between the opposing primary and secondary sides.

3. The electrical adapter of claim 2 wherein the printed wiring board further comprises at least one circuit layer between opposing primary and secondary sides, the circuit layer comprising the printed circuit.

4. The electrical adapter of claim 1, further comprising one or more SMT devices and one or more discrete components, whereby signal input to the electrical adapter generate output signals equivalent to a circuit housed in a TO-type package.

5. The electrical adapter of claim 4 wherein one of the one or more SMT devices further comprises an oscillator.

6. An electrical device adapter, comprising:
   a printed wiring board having a circuit layer and opposing primary and secondary sides;
   a plurality solder pads arranged on the primary side of the printed wiring board to interconnect with input/output signal pins of a surface mount technology (SMT) device, the solder pads electrically interconnected to the circuit layer of the printed wiring board;
   a plurality plated vias structured to accommodate one or more discrete electrical components and being electrically interconnected to the circuit layer of the board;
   a plurality plated through holes extending between the primary and secondary sides and being electrically interconnected to the circuit layer of the board, the plated through holes being positioned in a pattern structured to match plated through holes in a parent circuit board; and
   a plurality of elongated, interconnect pins inserted in respective ones of the plurality plated through holes and extending a distance from the secondary side of the printed wiring board, the interconnect pins being electrically and mechanically interconnected to the respective plated through holes and further the entirety of the interconnect pins extending from the secondary side of the printed wiring board being arranged in a circular pattern that is substantially identical to a known TO-type package.

7. The electrical device adapter of claim 6 wherein the printed wiring board further comprises the circuit layer sandwiched between the opposing primary and secondary sides.

8. The electrical device adapter of claim 6 wherein the printed wiring board further comprises a ground layer sandwiched between the opposing primary and secondary sides.

9. The electrical device adapter of claim 6 wherein the plurality plated vias further comprises a plurality of plated through holes extending between the primary and secondary sides of the board.

10. The electrical adapter of claim 6, further comprising one or more SMT devices soldered to one or more of the plurality solder pads on the printed wiring board, the one or more SMT devices selected to generate a output signals equivalent to a circuit housed in TO-type package in response to a signal input to the electrical adapter.

11. The electrical adapter of claim 10, further comprising one or more discrete components soldered to one or more of the plated vias, the one or more discrete components selected to moderate one or more of the input and output signals of the one or more SMT devices.

12. The electrical adapter of claim 11 wherein one of the SMT device further comprises an oscillator device.

13. The electrical adapter of claim 12 wherein the one or more discrete components are selected from a group discrete components consisting of resistors, capacitors, and inductors.

14. An electrical device adapter, comprising:
   a printed wiring board having at least a circuit layer and a ground layer between opposing primary and secondary sides;
   a plurality surface mount technology (SMT) device solder pads arranged on the primary side of the printed wiring board to accommodate a plurality of input/output signal pins of a SMT device;
   a plurality of plated vias electrically coupled between the solder pads and the circuit layer of the printed wiring board;
   a first plurality plated through holes extending between the primary and secondary sides and being electrically interconnected to the circuit layer of the printed wiring board, different pairs of the first plurality of plated through holes being structured to accommodate different discrete electrical components;
   a second plurality plated through holes extending between the primary and secondary sides and being electrically interconnected to the circuit layer of the printed wiring board, the second plurality of plated through holes being arranged in a circular pattern structured to imitate leads of a conventional TO-type device package; and
   an elongated input/output signal interconnect pin soldered in two or more of the second plurality plated through holes and extending a distance from the secondary side of the printed wiring board.

15. The electrical device adapter of claim 14 wherein the a plurality of plated vias electrically coupled between the solder pads and the circuit layer of the printed wiring board further comprises a third plurality of plated through holes extending between the primary and secondary sides and being electrically interconnected to the circuit layer of the printed wiring board.

16. The electrical device adapter of claim 14 wherein the printed wiring board further comprises a single circuit layer and a single ground layer between the primary and secondary sides.

17. The electrical device adapter of claim 14, further comprising one or more SMT devices and one or more discrete components, whereby a signal input to the electrical adapter via one or more of the interconnect pins equivalent to input signal leads of an oscillator circuit housed in a TO-type device package generates an output signal on one or more different ones of the interconnect pins equivalent to output signal leads of an oscillator circuit housed in a TO-type device package that is equivalent to an oscillator circuit housed in a TO-type device package.

* * * * *